United States Patent [19]
Nakao

[11] Patent Number: 5,324,920
[45] Date of Patent: Jun. 28, 1994

[54] HEAT TREATMENT APPARATUS

[75] Inventor: Ken Nakao, Sagamihara, Japan

[73] Assignee: Tokyo Electron Sagami Limited, Kanagawa, Japan

[21] Appl. No.: 779,254

[22] Filed: Oct. 18, 1991

[30] Foreign Application Priority Data

Oct. 18, 1990 [JP] Japan .................. 2-280522
Oct. 18, 1990 [JP] Japan .................. 2-280523

[51] Int. Cl.$^5$ ............... H05B 3/64; F27B 5/16
[52] U.S. Cl. .................... 219/542; 219/385; 219/395; 219/536; 338/316; 392/416; 392/418
[58] Field of Search ........... 219/535, 385, 395, 398, 219/370, 542, 411, 536, 552, 553, 390; 392/416, 418; 373/128, 129, 130, 134, 132; 118/725, 729; 338/283, 287, 319, 320, 316

[56] References Cited

U.S. PATENT DOCUMENTS

| | | | |
|---|---|---|---|
| 3,373,239 | 3/1968 | Rubisch | 219/443 |
| 3,912,905 | 10/1975 | Giler | 219/443 |
| 4,262,192 | 4/1981 | Giler | 219/542 |
| 4,296,311 | 10/1981 | Hagglund | 219/542 |
| 4,450,343 | 5/1984 | Dundon | 219/536 |
| 4,894,515 | 1/1990 | Hurko | 219/463 |
| 4,950,870 | 8/1990 | Mitsuhashi | 219/411 |
| 5,001,327 | 3/1991 | Hirasawa et al. | 219/390 |

FOREIGN PATENT DOCUMENTS

| | | |
|---|---|---|
| 48-8657 | 3/1973 | Japan . |
| 108486 | 5/1987 | Japan . |
| 1-155194 | 6/1989 | Japan . |

*Primary Examiner*—Bruce A. Reynolds
*Assistant Examiner*—Michael D. Switzer
*Attorney, Agent, or Firm*—Oblon, Spivak, McClelland, Maier & Neustadt

[57] ABSTRACT

The heat treatment apparatus according to the invention comprising a process tube for holding a plurality of semiconductor wafers, a heating resistive element made mainly of molybdenum silicide and surrounding the process tube, a heat insulating member surrounding the heating resistive element and having a layer which made of material inert to silicon dioxide and faces the surface of the heating resistive element, and a securing member securing the heating resistive element to the heat insulating member, and made of material inert to silicon dioxide.

14 Claims, 5 Drawing Sheets

HEAT TREATMENT APPARATUS

BACKGROUND OF THE INVENTION

1. Field of the Invention

The present invention relates to a heat treatment apparatus, more particularly, to a heat treatment apparatus incorporating improved heating resistive element for heat-treating objective material

2. Description of the Related Art

Conventionally, various heat treatment apparatuses, such as thin-film formation apparatuses (e.g., a chemical vapor deposition apparatus and an epitaxial film growing apparatus), oxide film formation apparatuses, and thermal diffusion apparatuses for doping impurities, have been used in processing semiconductor wafers.

Of these, any conventional diffusion type heat treatment apparatus for performing various heat treatments on semiconductor wafers comprises a process tube loaded with a plurality of semiconductor wafers, a heating resistive element, and a heat insulating member surrounding the heating resistive element.

A spiral heater made of FeCrAl is made available as heating resistive element. The spiral heater can raise the temperature in the process tube to temperatures as high as 1200° C. The heat insulating member is made of, for example, laminated ceramic fibers. The ceramic-fiber insulating member decreases the quantity of heat which is radiated and conducted from the heater, in order that semiconductor wafers can effectively be heat treated.

Since the conventional diffusion-type heat treatment apparatus mentioned above has a spiral heater made of FeCrAl having relatively low density of allowable current, the temperature inside of the process tube is raised at only about 10° C./min. In consequence, it is difficult for the heat treatment apparatus to heat-treat semiconductor wafers at high speed. Furthermore, the heating resistive element deforms much when heated to high temperatures, inevitably contacting the heat insulating member. Upon contacting the insulating member, the element reacts with the insulating material and is subsequently cut.

To enhance the wafer processing efficiency, a heat treatment apparatus has been developed which has a lamp capable of raising the temperature at 50° to 100° C. per second. Nevertheless, when this apparatus is operated, the surface of each semiconductor wafer loaded in the process tube is not uniformly heated, a temperature difference of about 40° C. is detected between the most heated portion and the least heated portion. This results in crystal defects, like slip, in the processed semiconductor wafer.

On the other hand, an electric furnace incorporating heating elements made of molybdenum silicide ($MoSi_2$) is disclosed in Published Unexamined Japanese Patent Application No. 48-8657 of 1973. Published Unexamined Japanese Patent Application No. 1-155194 of 1989 discloses a heat treatment furnace having a plurality of heaters and heat insulating members which are located in a plurality of heating zones, respectively.

SUMMARY OF THE INVENTION

An object of the invention is to provide a heat treatment apparatus which can quickly raise the temperature of objective material, such as semiconductor wafers loaded in a process tube, can heat-treat the material at high speed, and can reliably prevent a heating resistive element from thermally reacting with a heat insulating member and from being cut.

According to an aspect of to the invention, a heat treatment apparatus is provided, which comprises:

a process tube for holding a plurality of objects to be heat-treated;

a heating resistive element made mainly of molybdenum silicide and surrounding the process tube;

a heat insulating member surrounding the heating resistive element and having a layer which made of material inert to silicon dioxide and which faces the surface of the heating resistive element; and a securing member securing the heating resistive element to the heat insulating member, and at least a surface of the securing member made of material inert to silicon dioxide.

The objects loaded in the process tube can be semiconductor wafers. These semiconductor wafers are set in a boat, which is inserted into the process tube.

The heat insulating member is composed of laminated ceramic fibers, such as alumina-silica fibers containing a minimum of 90% by weight of alumina. It is desired that the layer formed on the heat insulating member be made of material which is inert to silicon dioxide and does not contaminate the semiconductor wafers. More specifically, the layer should be made of molybdenum silicide or mullite.

It is also desired that at least the surface of the securing member be made of material which is inert to silicon dioxide and does not contaminate the semiconductor wafers. More specifically, the surface of the securing member should be made of mullite. In particular, it is desired that the securing member, as a whole, be made of material inert to silicon dioxide such as mullite.

In the heat treatment apparatus embodying the invention, the heating resistive element surrounding the process tube is made mainly of molybdenum silicide ($MoSi_2$) and exhibits allowable surface load density of about 20 W/$cm^2$ at 1200° C. By virtue of the heating resistive element, the apparatus of the invention can quickly raise the interior temperature of the process tube at 50° to 100° C./min after activating power supply to the heating resistive element. Hence, the apparatus can quickly treat the objects, (e.g., semiconductor wafers) in the process tube, causing no crystal defect such as slip in the objects. In other words, the apparatus ca heat-treat objects with high efficiency.

When a heating resisting element made chiefly of molybdenum silicide ($MoSi_2$) is heated, silicon dioxide ($SiO_2$) deposits itself, forming a thin film on the surface of the element. This protects the heating resistive element. If the element is directly secured to a heat insulating member, the silicon dioxide film will instantaneously react with the securing member, will be etched, and will easily be cut.

On the other hand, if the heating resistive element is thermally deformed and then brought into contact with the heat insulating member held by the securing member, the protective film will instantaneously react with the heat insulating member and will easily be cut.

To prevent the cutting of the heating resistive member, the heat treatment apparatus of the invention has a layer made of material inert to silicon dioxide and formed on that surface of the heat insulating member which opposes the heating resistive element. Further that surface of the securing member which contacts the heating resistive element is made of material inert to silicon dioxide. Therefore, the protective film made of silicon dioxide and formed on the heating resistive element is prevented from reacting with the securing member or the heat insulating member and from being etched. As a result, the heating resistive element will not be cut at all.

Since the heating resistive element can have a small capacity, it is possible to lower the temperature inside the process tube at high speed.

According to another aspect of the invention, a heat treatment apparatus is provided which comprises:

a process tube for holding a plurality of objects to be heat-treated;

a heating resistive element made mainly of molybdenum silicide and surrounding the process tube; and a heat insulating member surrounding the heating resistive element and having a layer made of material inert to silicon dioxide and covering that portion of the heat insulating member which contacts the heating resistive element.

Before securing the heating resistive element to the heat insulating member, a recess is formed in the heat insulating member for holding the heating resistive element. In this case, it is essential that the layer be thicker than the depth of the recess of the heat insulating member.

The heat treatment apparatus of the invention can quickly heat-treat the object (e.g., semiconductor wafers) loaded in the process tube, without causing crystal defects, such as slip, in the objects. The apparatus can heat-treat semiconductor wafers with high efficiency. The layer made of material inert to silicon dioxide is formed on that surface of the heat insulating member to which the heating resistive element is secured. The protective film made of silicon dioxide and formed on the heating resistive element is prevented from reacting with the heat insulating member. The heating resistive elements is thereby prevented from being cut.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Referring now to the accompanying drawings, the vertical-type heat treatment apparatus of the invention will be described in detail.

Figure 1:
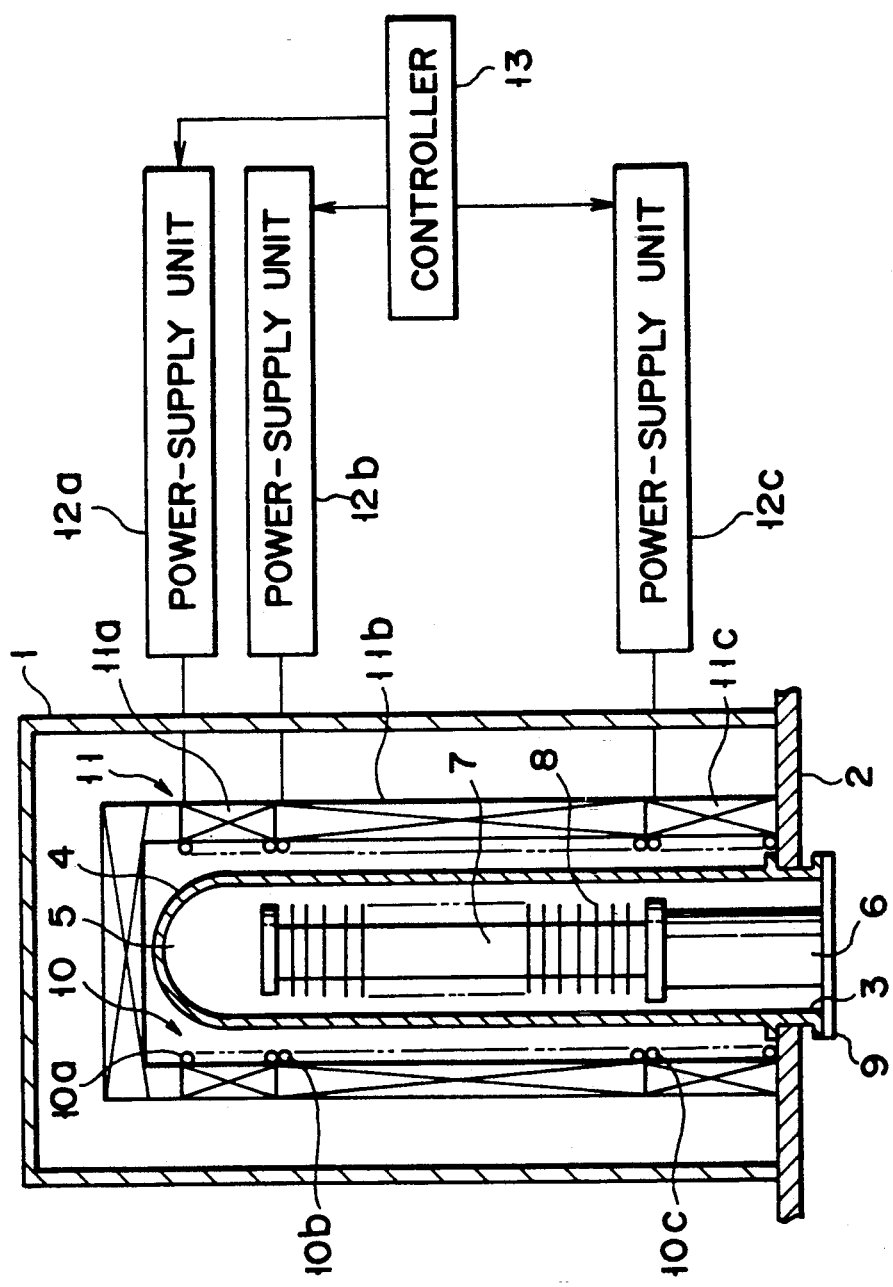
FIG. 1 schematically shows a sectional view of a vertical-type heat treatment apparatus according to an embodiment of the invention.

As is shown in FIG. 1, a casing 1 having an aperture in the bottom is vertically erected on a base plate 2 made of, for example, stainless steel. A process tube 4 made of quartz and having a boat-inserting aperture 3 in the bottom is located inside the casing 1. The process tube 4 is also vertically erected on the base plate 2. The interior of the process tube 4 defines a thermal processing chamber 5.

A thermal cylinder 6 is detachably inserted, in the thermal processing chamber 5 through the boat-inserting aperture 3. A boat 7 is mounted on the thermal cylinder 6. Semiconductor wafers 8 are horizontally set on the boat 7 at equal intervals. The thermal cylinder 6 is mounted on a flange cap 9. The cap 9 is secured to an elevating arm (not shown) so that it can move up and down. More precisely, as the flange cap 9 moves in the vertical direction, both the thermal cylinder 6 and the boat 7 move in the same direction. When the top of the thermal cylinder 6 comes into contact with the bottom of the process tube 4, the boat-inserting aperture 3 is tightly closed.

A heating-element unit 10 (concretely, Quantor Superheater, a product of Quantor) made chiefly of molybdenum silicide ($MoSi_2$) surrounds the process tube 4. A heat insulating unit 11 composed of laminated alumina-silica fibers is secured to and surrounds the unit 10.

The heating-element unit 10 comprises three heating resistive elements 10a to 10c which are vertically aligned. Power-supply units 12a to 12c are connected to the elements 10a to 10c respectively. A controller 13 is connected to these power-supply units 12a to 12c for properly controlling the amount of power to supply to the elements 10a to 10c from the power-supply units 12a to 12c, in accordance with the thermal conditions in the top, intermediate, and bottom zones of the chamber 5. The heating-element unit 10 properly heats these vertical zones. Like the heating-element unit 10, the heat insulating unit 11 comprises three heat insulating members 11a to 11c aligned vertically.

These heat insulating members 11a to 11c are shaped like a cylinder. Each heat insulating member is composed of two halves of the type shown in FIG. 2. The heating resistive elements 10a to 10c are also shaped like a cylinder, each comprising two halves.

Figure 2:
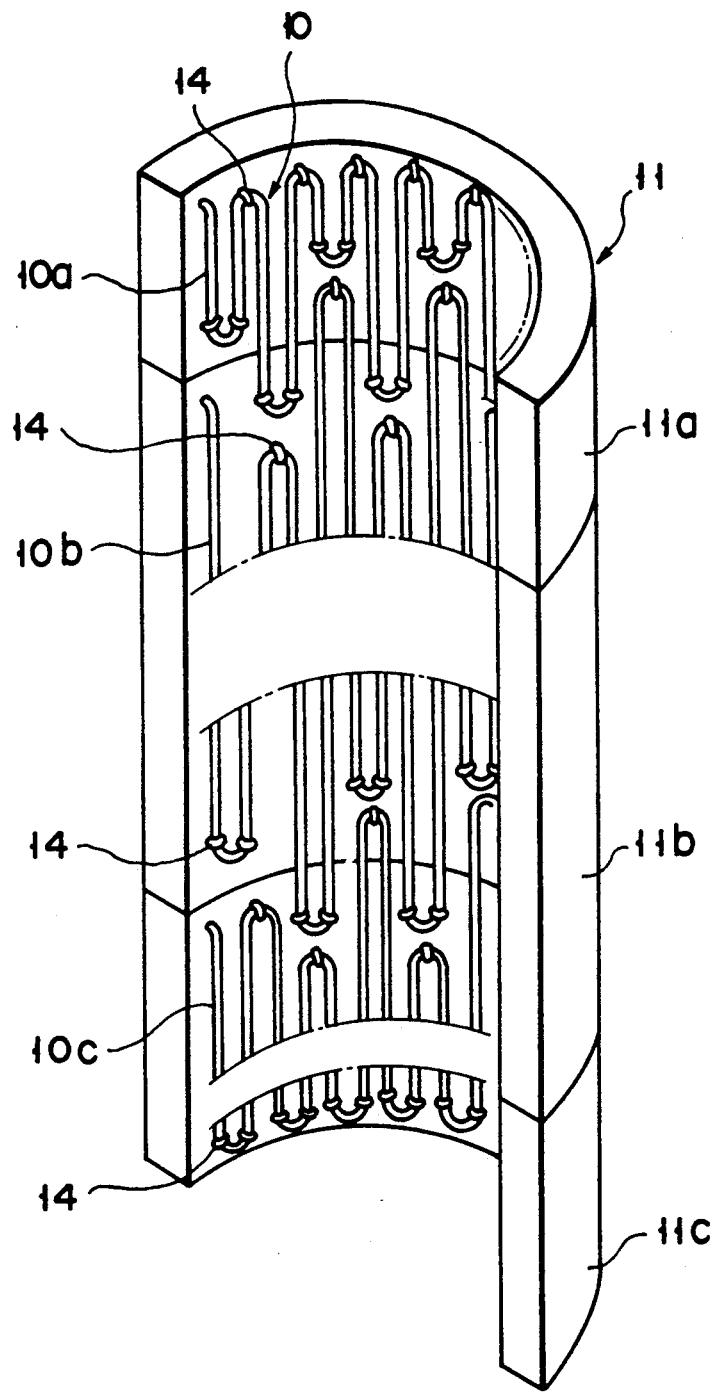
FIG. 2 is a perspective view of the heating resistive elements and the heat insulating members shown in FIG. 1.
Figure 5:
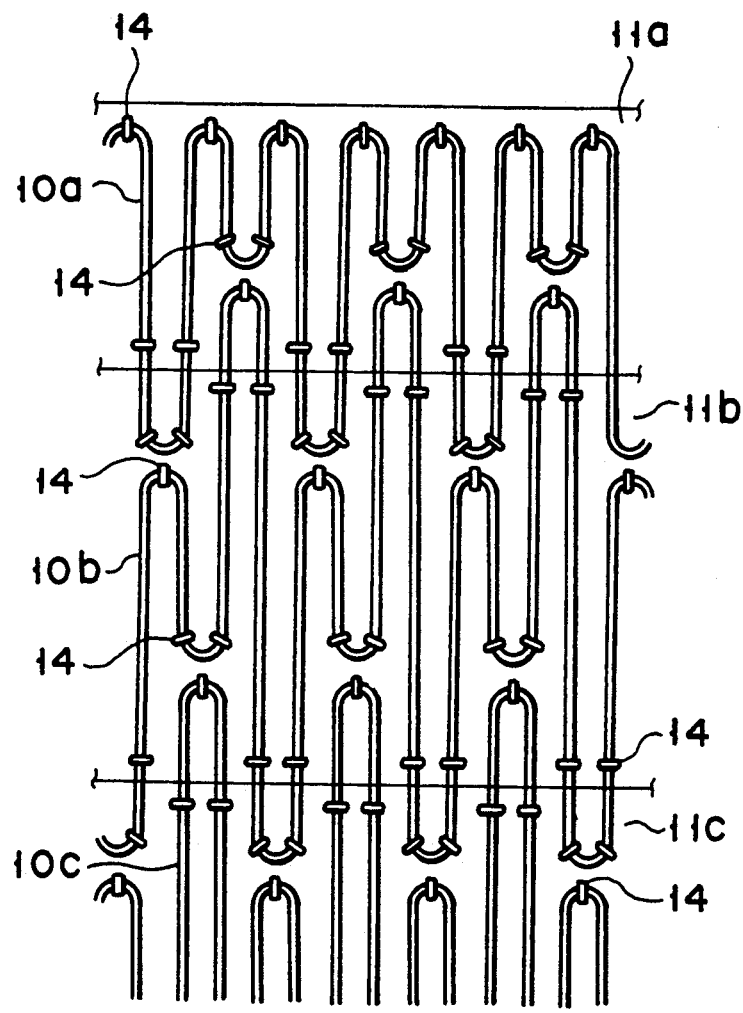
FIG. 5 is a front view of the heating resistive elements aligned on the heat insulating members.

As is shown in FIGS. 2 and 5, the heating resistive elements 10a to 10c are aligned, forming a continuous conductive wire folded in the U-shape at the top and bottom ends. These elements 10a to 10c are respectively folded U shape, such that their long and short vertical portions are alternately located. Furthermore, those U-shaped top and bottom ends are arranged, alternately projecting and recessing every other file across the vertical adjoining borderline.

Figure 3:
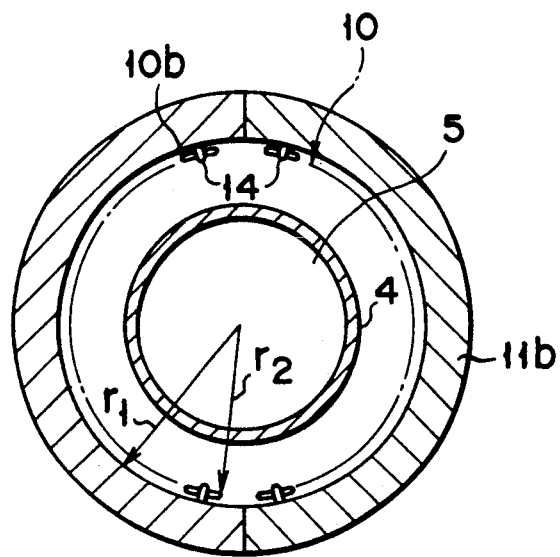
FIG. 3 is a horizontal sectional view of the heating resistance elements, the heat insulating members, and staples shown in FIG. 1.
Figure 4:
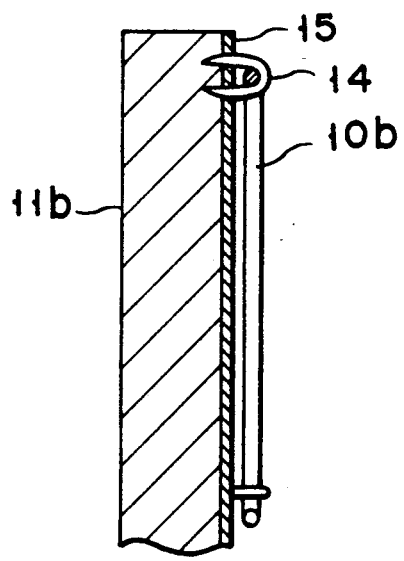
FIG. 4 is an enlarged vertical sectional view of the heating resistive elements, the heat insulating members, and staples shown in FIG. 1.

As is shown in FIGS. 3 and 4, a plurality of staples respectively secure those heating resistive elements 10a to 10c to the inner circumferential surfaces of the corresponding the heat insulating members 11a to 11c, spacing the elements 10a to 10c from the inner circumferential surfaces. More particularly, assume that the heat insulating member 11b and the corresponding heating resistive element 10b have radius $r_1$ and $r_2$ as shown in FIG. 3. In this case, the heating resistive element 10b is secured to the heat insulating member 11b at a specific interval so that the radius $r_1$ is greater than the radius $r_2$. All staples 14 are made of material inert to silicon dioxide ($SiO_2$), such as mullite or molybdenum silicide.

The method of securing the elements 10a to 10c to the insulating members 11a to 11c with staples 14 will be described.

The staples 14 are respectively secured to the heat insulating members 11a to 11c, by sandwiching the top U-shaped ends of the heating resistive elements 10a to 10c. In other words, the elements 10a to 10c are secured to the heat insulating members 11a to 11c respectively by these staples 14. The staples 14 are respectively pinned to the heat insulating members 11a to 11c by sandwiching only the top U-shaped ends of the heating resistive elements 10a to 10c by holding the bottom ends in free condition. Furthermore, additional staples 14 are pinned to the heat insulating members 11a to 11c by sandwiching the desired linear parts of the elements 10a to 10c. Substantial intervals are provided between the vertically adjoining U-shaped ends of the elements 10a to 10c. The elements 10a to 10c can thereby be prevented from contacting each other when they are thermally deformed. By securing these heating resistive elements 10a to 10c to the predetermined positions, mentioned above, with the staples 14, the elements 10a to 10c are suspended at their bottom ends from the inner circumferential surfaces of the corresponding heat insulating members 11a to 11c.

As is shown in FIG. 4, the inner circumferential surfaces of the heat insulating members 11a to 11c securing the heating resistive elements 10a to 10c are each covered with a layer 15 made of material inert to silicon dioxide, such as mullite.

In the heat treatment apparatus of the invention, the heating-element unit 10 made mainly of molybdenum silicide ($MoSi_2$) and provided on the external circumferential surface of the process tube 4 exhibits minimal resistance at normal temperature and high resistance at extremely high temperature. When generating 1200° C. of heat, the heating-element unit 10 has allowable surface load density of about 20 W/cm$^2$. Because of this, in contrast with any conventional heating-element unit made of FeCrAl which raises temperature at 10° C./min, the heating-element unit 10 can quickly heat the thermal processing chamber 5, raising the temperature at 100° C./min. As a result, even during a batch-basis production process, the apparatus of the invention can effectively and quickly heat-treat the semiconductor wafers 8 causing no crystal defect such as slip in the semiconductor wafer 8. Therefore, the batch-basis production process includes the sequential steps of: placing semiconductor wafers 8 in the boat 7, mounting the boat 7 on the thermal cylinder 6 placed on the flange cap 9, loading the boat 7 in the thermal processing chamber 5, and performing heat treatment on the semiconductor wafers 8 by means of the heating-element unit 10.

Furthermore, as mentioned earlier, whenever generating heat, the heating-element unit 10, made mainly of molybdenum silicide, causes silicon dioxide to deposit itself on the surfaces of the heating resistive elements 10a to 10c, thus forming film protecting the whole surfaces of the elements 10a to 10c. As mentioned earlier, if the elements 10a to 10c were directly secured to the heat insulating members 11a to 11c, the protective film of silicon dioxide would easily react with the staples 14 and would inevitably be etched and cut. Moreover, if the elements 10a to 10c thermally being deformed, contacted the heat insulating members 11a to 11c held by those staples 14, the protective film made of silicon dioxide would instantaneously react with the heat insulating members 11a to 11c, thus etching and cutting the heating resistive elements 10a to 10c.

To prevent the cutting of the elements 10a to 10c, the apparatus of the invention has the layer 15 made of material inert to silicon dioxide, such as mullite, and formed on the those surfaces of the heat insulating members 11a to 11c which oppose the heating resistive elements 10a to 10c. For the same purpose, the staples 14 are made of material exactly identical to that of the layer 15, such as mullite. As a result, the protective film made of silicon dioxide and formed on the surfaces of the elements 10a to 10c are prevented from reacting with the staples 14 or the heat insulating members 11a to 11c. Therefore, the protective film does not cause the etching of the heating resistive elements 10a to 10c. Furthermore, as is shown in FIG. 3, the heating resistive elements 10a to 10c are secured to, and spaced from, the corresponding heat insulating members 11a to 11c at the predetermined intervals. This in turn reliably prevents the elements 10a to 10c from contacting the inner circumferential surfaces of the heat insulating members 11a to 11c. Therefore, even during continuous operation of the apparatus, the resistive heating elements 10a to 10c can be prevented form being cut. The elements 10a to 10c have a long life time.

Furthermore, since the three heating resistive elements 10a to 10c, which are aligned vertically at the top, intermediate, and bottom zones, are connected to the controller 13 by the power-supply units 12a to 12c, the controller 13 can properly control the amount of power to supply from these units 12a to 12c to the elements 10a to 10c in accordance with temperatures in the top, intermediate, and bottom zones of the chamber 5. Hence, the temperature in the top, intermediate, and bottom zones of a thermal processing chamber 5 can be independently controlled based on the optimal heating conditions for these zones.

Furthermore, as is shown in FIGS. 2 and 5, the heating resistive elements 10a to 10c are aligned, forming a vertically continuous conductive wire folded in U-shape at the top and bottom ends. They are arranged such that their long and short vertical portions are alternately located. Further, the U-shaped parts in the top and bottom ends are arranged, alternately projecting and recessing every other file along the vertically adjoining borderline. Since these elements 10a to 10c are secured to the heat insulating members 11a to 11c by the staples 14, the apparatus of the invention can provide an execute uniform temperature distribution, even at the borders between the top, intermediate, and bottom zones.

Furthermore, since the heating resistive elements 10a to 10c are properly secured by staples 14 as is shown in FIGS. 2 and 5, the U-shaped bottom ends of the elements 10a to 10c can be held in free condition. Owing to this free condition, the U-shaped bottom ends can absorb the thermal expansion and subsequent contraction of these elements 10a to 10c. This effectively prevents the horizontally adjoining elements 10a to 10c from contacting each other.

The present invention is not limited to the above-described embodiment in which the unit 10 comprises three elements 10a to 10c aligned vertically. Rather, the invention can apply to a heat treatment apparatus, wherein the unit 10 comprises less or more heating resistive elements (e.g., five elements).

Furthermore, in the embodiment of the invention described above, the interior of the wafer processing chamber 5 of the process tube 4 is divided into the top, intermediate, and bottom zones. The embodiment has the heating-element unit 10 consisting of three heating resistive elements 10a to 10c for heating the top, intermediate, and bottom zones. The controller 13 properly controls the amounts of power to be supplied from the units 12a to 12c to the heating resistive elements 10a to 10c. The scope of the invention is not confined to the structure described above. For example, each heating resistive element can comprises parts located in one zone of the processing chamber 5, and connected to the controller 13 by power-supply units, as described above. In this case, the temperature in the chamber 5 can be distributed more uniformly.

Figure 6:
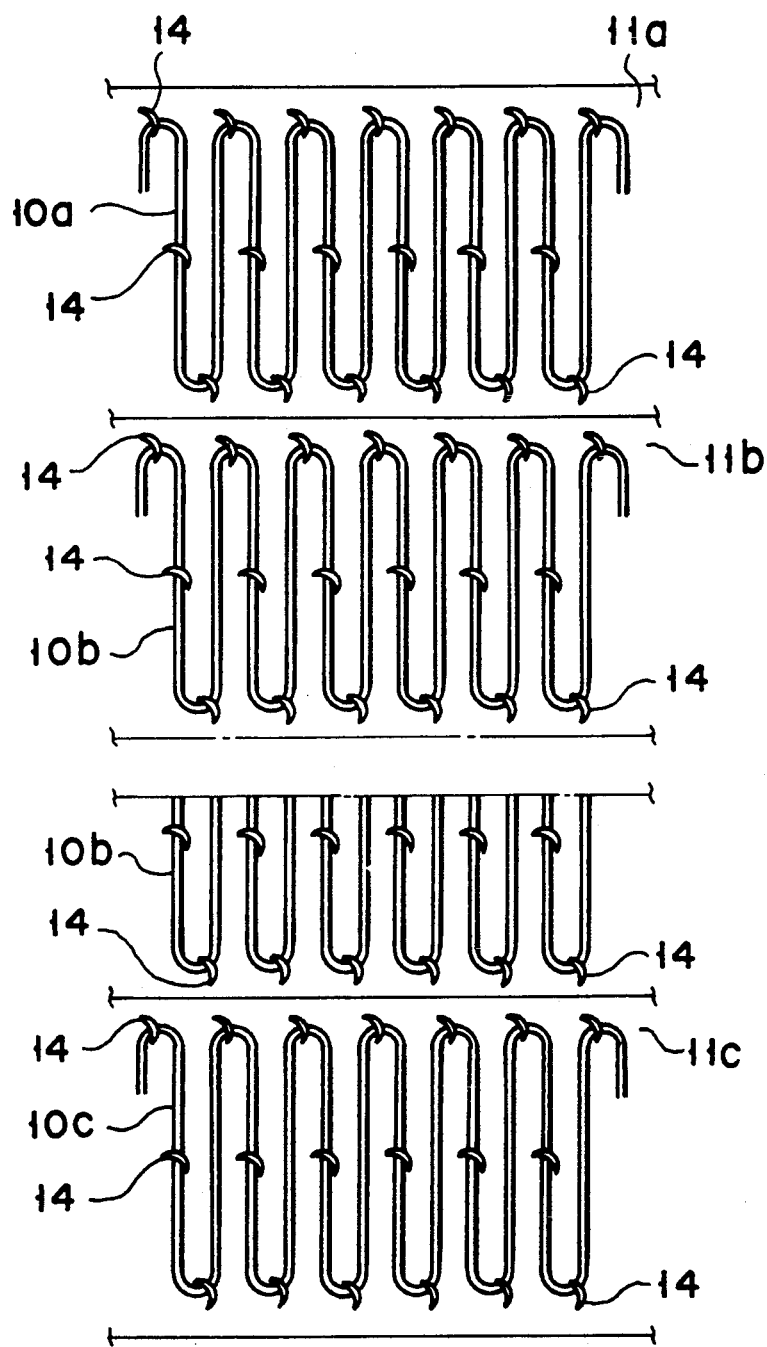
FIG. 6 is a front view of the heating resistive elements arranged in a different manner on the heat insulating members.

According to the embodiment of the invention, the elements 10a to 10c are secured to the heat insulating members 11a to 11c by the staples 14 as is shown in FIGS. 2 and 5. Instead, the elements 10a to 10c can be secured to the heat insulating members 11a to 11c as is shown in FIG. 6. More specifically, each of the heating resistive elements 10a to 10c is made of a conductive wire folded in the U-shape at its top and bottom ends, such that both vertically continuous portions are equally long. The elements 10a to 10c are secured to the inner circumferential surfaces of the corresponding heat insulating members 11a to 11c, spaced therefrom by means of staples 14.

It will now be described how the heating resistive elements 10a to 10c are secured by the staples 14.

All staples 14 are pinned to the heat insulating members 11a to 11c by sandwiching the U-shaped upper ends of the members 10a to 10c in the suspended condition. The staples 14 are pinned to the heat insulating members 11a to 11c by sandwiching the U-shaped bottom ends of the elements 10a to 10c. Owing to this structure, the heating resistive elements 10a to 10c are secured to the corresponding heat insulating members 11a to 11c by suspension. The staples 14 are pinned to the heat insulating members 11a to 11c by sandwiching the U-shaped bottom ends of the elements 10a to 10c. Furthermore, those staples 14 are pinned to the members 11a to 11c by sandwiching the intermediate positions of the left-side linear parts of the elements 10a to 10c, which extend downward from the U-shaped top ends. Specific intervals are provided between the top ends and the U-shaped bottom ends adjoining other U-shaped top and bottom ends of the heating resistive elements 10a to 10c so that these elements 10a to 10c can be prevented from contacting each other, even if these elements 10a to 10c are thermally deformed. Furthermore, the staples 14 are respectively pinned to the heat insulating members 11a to 11c by tilting them to the left, off the vertical direction.

Since the heating resistive elements 10a to 10c are secured to the corresponding heat insulating members 11a to 11c as is shown in FIG. 6, thermal expansion and subsequent contraction of the elements 10a to 10c can be absorbed in the gaps among staples 14 pinned to the U-shaped bottom ends of the heating resistive elements 10a to 10c.

Furthermore, mutual repulsion of the linear parts of the elements 10a to 10c, caused by the electromagnetic force between the elements 10a to 10c, can effectively be suppressed by the staples 14 secured to the linear parts. On the other hand, those linear parts of the heating resistive elements 10a to 10c, which are free of staples 14, can be balanced by the repulsion between those linear parts held at both ends by staples 14, thus effectively preventing excessive deformation. Hence, even when repulsion is generated between the linear parts of the heating resistive elements 10a to 10c, resulting from the thermal deformation of the electromagnetic force in, the heating resistive elements 10a to 10c, those linear parts of elements 10a to 10c adjoining themselves in the horizontal direction can be prevented form contacting each other due to the staples 14 inserted in the heat insulating members 11a to 11c and located at the predetermined positions.

The above description has solely referred to the vertical type heat treatment apparatus of the invention. However, the scope of the invention is not merely confined to the vertical-type apparatus; it can also be applied to a horizontal-type heat treatment apparatus. The horizontal-type apparatus also has heating resistive elements, aligned in the horizontal direction, each mode of a continuous conductive wire folded in the U-shape at both sides. To secure the heating resistive elements to the corresponding heat insulating members, staples are not secured to the curving portions of the heating resistive elements, but to the intermediate linear parts thereof, so that the heating resistive elements can expand and contract themselves in the horizontal direction.

As is clear from the above, the invention provides a novel heat treatment apparatus which can perform heat treatment at high speed on a plurality of objects (e.g., semiconductor wafers) loaded in the process tube, without causing crystal defects, such as slip, in the objects.

Furthermore, the heat treatment apparatus according to the invention can reliably prevent the heating resistive elements made mainly of molybdenum silicide from being cut, by virtue of the protective film composed of silicon dioxide protecting the heating resistive elements from reaction with securing members and heat insulating members. The apparatus components can therefore have a long life time.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A heat treatment apparatus comprising:
   a process tube holding a plurality of objects to be heat-treated;
   a heating resistive element made mainly of molybdenum silicide and surrounding said process tube, said heating resistive element including a first part opposing said object, and second and third parts which are located at the upper and lower sides of the first part, respectively, said first, second and third parts being arranged to meander and each having folded upper ends and folded lower ends, the folded upper ends of said first part and the folded lower ends of said second part being arranged in an interdigital fashion, and the folded lower ends of said first part and the folded upper ends of said third part being arranged in an interdigital fashion;
a heat insulating member surrounding said heating resistive element and having a layer which is made of material inert to silicon dioxide and faces said heating resistive element; and
a securing member securing said heating resistive element to said heat insulating member, at least a surface of said securing member being made of material inert to silicon dioxide.

2. The apparatus according to claim 1, wherein said material inert to silicon dioxide is mullite.

3. The apparatus according to claim 1, wherein said heat insulating member has a cylindrical shape.

4. The apparatus according to claim 1, wherein said heat insulating member is made of ceramic fibers.

5. The apparatus according to claim 1, wherein said heat insulating member includes three parts arranged in a similar way to that of the first, second, and third parts of said heating resistive element.

6. A heat treatment apparatus comprising:
a process tube standing upright and holding a plurality of objects to be heat-treated;
a heating resistive element made mainly of molybdenum silicide and surrounding said process tube, said heating resistive element being arranged to meander and having folded upper ends and folded lower ends;
a heat insulating member surrounding said heating resistive element; and
securing members holding the folded upper ends of said heating resistive element in suspension to position said folded lower ends with a specific distance maintained therebetween, thereby preventing the folded lower ends coming into contact with each other even when said folded lower ends are deformed, wherein said securing members comprise at least a top securing member holding each top folded end such that a position of said top folded end is fixed, said securing means permitting lower ends of said heating resistive element to move vertically.

7. The apparatus according to claim 6, wherein said heat insulating member has a layer which is made of material inert to silicon dioxide and faces said heating resistive element.

8. The apparatus according to claim 7, wherein said material inert to silicon dioxide is mullite.

9. The apparatus according to claim 6, wherein said heat insulating member has a cylindrical shape.

10. The apparatus according to claim 6, wherein said heat insulating member is made of ceramic fibers.

11. The apparatus according to claim 6, wherein at least a surface of said securing member is made of material inert to silicon dioxide.

12. The apparatus according to claim 11, wherein said material inert to silicon dioxide is mullite.

13. The apparatus according to claim 6, wherein said securing members further comprise additional securing members holding said heating resistive element at right and left intermediate positions vertically away from said folded upper ends, thereby permitting the folded lower ends of said heating resistive element to move downwardly and preventing said heating resistive element from moving in the horizontal direction.

14. The apparatus according to claim 9, wherein said heating resistive element is aligned along the inner surface of said cylindrical heat insulating member.

* * * * *